(12) United States Patent
Ryvkin et al.

(10) Patent No.: US 9,478,943 B2
(45) Date of Patent: Oct. 25, 2016

(54) SEMICONDUCTOR LASER

(75) Inventors: Boris Ryvkin, St. Petersburg (RU);
Juha Kostamovaara, Oulu (FI)

(73) Assignee: Oulun Yliopisto, Oulu (FI)

( * ) Notice: Subject to any disclaimer, the term of this patent is extended or adjusted under 35 U.S.C. 154(b) by 489 days.

(21) Appl. No.: 12/993,651

(22) PCT Filed: May 26, 2009

(86) PCT No.: PCT/FI2009/050438
§ 371 (c)(1),
(2), (4) Date: Feb. 18, 2011

(87) PCT Pub. No.: WO2009/144376
PCT Pub. Date: Dec. 3, 2009

(65) Prior Publication Data
US 2011/0134951 A1    Jun. 9, 2011

(30) Foreign Application Priority Data
May 28, 2008    (FI) .................................... 20085512

(51) Int. Cl.
H01S 5/20    (2006.01)
H01S 5/062   (2006.01)
H01S 5/065   (2006.01)
H01S 5/32    (2006.01)

(52) U.S. Cl.
CPC ......... H01S 5/06216 (2013.01); H01S 5/2031 (2013.01); H01S 5/0655 (2013.01); H01S 5/3213 (2013.01)

(58) Field of Classification Search
CPC ............................ H01S 5/2031; H01S 5/3213
USPC ....................................................... 372/45.01
See application file for complete search history.

(56) References Cited

U.S. PATENT DOCUMENTS

| | | | |
|---|---|---|---|
| 6,324,199 B1 | 11/2001 | Capasso et al. | |
| 6,522,677 B1* | 2/2003 | Petrescu-Prahova et al. | ............ 372/45.01 |
| 6,606,334 B1* | 8/2003 | Shigihara et al. | ......... 372/45.01 |
| 2001/0009558 A1* | 7/2001 | Shigihara | ......................... 372/45 |
| 2002/0001325 A1* | 1/2002 | Igarashi | ........................... 372/43 |
| 2002/0051615 A1 | 5/2002 | Walpole et al. | |
| 2004/0179565 A1 | 9/2004 | Ohkubo et al. | |

(Continued)

FOREIGN PATENT DOCUMENTS

| | | |
|---|---|---|
| WO | WO 91/16747 | 10/1991 |
| WO | WO 96/08062 | 3/1996 |
| WO | WO 02/41456 A2 | 5/2002 |

OTHER PUBLICATIONS

Vainshtein, S. N., et al., "Deriving of Single Intensive Picosecond Optical Pulses From a High-Power Gain-Switched Laser Diode by Spectral Filtering," *Journal of Applied Physics*, vol. 84, No. 8, pp. 4109-4113, Oct. 15, 1998.

(Continued)

*Primary Examiner* — Tod T Van Roy
(74) *Attorney, Agent, or Firm* — Hamilton, Brook, Smith & Reynolds, P.C.

(57) ABSTRACT

A single pulse semiconductor laser operating in the gain-switching regime comprises a plane asymmetric waveguide and an active layer in the waveguide, the ratio of a thickness of the active layer to an optical confinement factor of the laser being extremely large, larger than about 5 μm, for example.

9 Claims, 5 Drawing Sheets

(56) References Cited

U.S. PATENT DOCUMENTS

2007/0002914 A1* 1/2007 Ryu ..................... H01S 5/2004
                                                          372/45.01
2007/0036190 A1   2/2007 Abeles et al.

OTHER PUBLICATIONS

International Preliminary Report on Patentability for PCT/FI2009/050438, date of mailing Sep. 28, 2010.
International Search Report for PCT/FI2009/050438, date of mailing Sep. 14, 2009.
Search Report, FI 20085512, dated Feb. 25, 2009.
Buda, M., et al., "Carrier Injection in low confinement laser structures with separate narrow active and guiding layers," *Julkaisussa Proceedings of Semiconductor Conference (CAS 95)*. Lokakuu 1995, s. 461-464, koko julkaisu.
Klotzkin, et al., "DC, modulation, and gain-switched characteristics of self-organized In0.4Ga0.6As/GaAs quantum dot room temperature lasers," *Julkaisussa Technical Digest of Electron Devices Meeting (IEDM 97)*. Joulukuu 1997, s. 385-388, koko julkaisu.
Shigihara, K., et al., "High-Power 980-nm Ridge Waveguide Laser Diodes Including an Asymmetrically Expanded Optical Field Normal to the Active Layer," *IEEE Journal of Quantum Electronics*, vol. 38, No. 8, pp. 1081-1088, Aug. 2002.
Botez, D., "Design Considerations and Analytical Approximations for High Continuous-Wave Power, Broad-Waveguide Diode Lasers," *Applied Physics Letters*, vol. 74, No. 21, pp. 3102-3104, May 24, 1999.
Kaltenbach, , et al., "Freely Triggerable Picosecond Pulses From a DBR Ridge Waveguide Diode Laser Near 1120 nm," IEEE Photonics Technology Letters, 28(8):915-918 (2016).
Ryvkin, B., et al., "Asymmetric waveguide laser diode for high-power optical pulse generation by gain switching," *J. Lightw. Technol.*, 27(12):2125-2131 (2009).
"Gain Switching, RP Photonics Encyclopedia," Retrieved from the Internet URL: https://www.rp-photonics.com/gain_switching.html; [retrieved on Mar. 28, 2016].

* cited by examiner

US 9,478,943 B2

SEMICONDUCTOR LASER

This application is the U.S. National Stage of International Application No. PCT/FI2009/050438, filed May 26, 2009, which designates the U.S., published in English, and claims priority under 35 U.S.C. §§119 or 365(c) to Finland Application No. 20085512, filed May 28, 2008.

FIELD

The invention relates to a semiconductor laser based on gain switching.

BACKGROUND

Various applications such as automobile safety devices, laser radars, 3-D imaging, laser tomography, time imaging spectroscopy, etc., require optical sources which generate high-power (10 W to 1000 W) single optical pulses in the picosecond range.

A high-power single pulse can be produced with a semiconductor laser diode which may have a double heterostructure laser chip. To be commercial, the energy of the optical pulse should be produced by low-cost, compact and reliable electric power sources. Suitable and readily available electric power sources can provide an electric pulse having a duration of a few nanoseconds, a reasonably symmetric shape and an amplitude of order 10 A.

There is a need for higher-power optical pulses generated using the low-cost power sources and there have also been attempts to increase the optical power. However, all the attempts have faced serious drawbacks. For example, if the amplitude of the electric current pulse is increased, the power of the optical pulse also increases but after a certain critical value a second optical pulse trailing the primary optical pulse will appear which is highly undesirable. The proposed increase in the volume or dimensions of the active layer may increase the power of the optical pulse but the increase also results in at least one trailing optical pulse. Theoretically, the electric current pulse may be formed such that it has a very sharp trailing end for reducing the probability of a trailing pulse, but that is beyond reach of or at least nontrivial to achieve with the high-power electronics at the moment.

BRIEF DESCRIPTION OF THE INVENTION

An object of the invention is to provide an improved laser. According to an aspect of the invention, there is provided a single pulse semiconductor laser operating in the gain-switching regime. The laser comprises a plane asymmetric waveguide and an active layer in the waveguide, the ratio of a thickness of the active layer to an optical confinement factor of the laser being larger than about 5 µm.

According to another aspect of the invention, there is provided a method of manufacturing a single pulse semiconductor laser operating in the gain-switching regime. The method further comprises forming a plane asymmetric waveguide with an active layer in the waveguide such that the ratio of a thickness of the active layer to an optical confinement factor of the laser is larger than about 5 µm.

The invention provides several advantages. The amplitude of the injection current can be high without generating an optical trailing pulse after the main optical pulse.

LIST OF DRAWINGS

In the following, the invention will be described in greater detail with reference to the embodiments and the accompanying drawings, in which FIGS. 1A and 1B show a structure of a semiconductor laser;

DESCRIPTION OF EMBODIMENTS

Figure 1A:
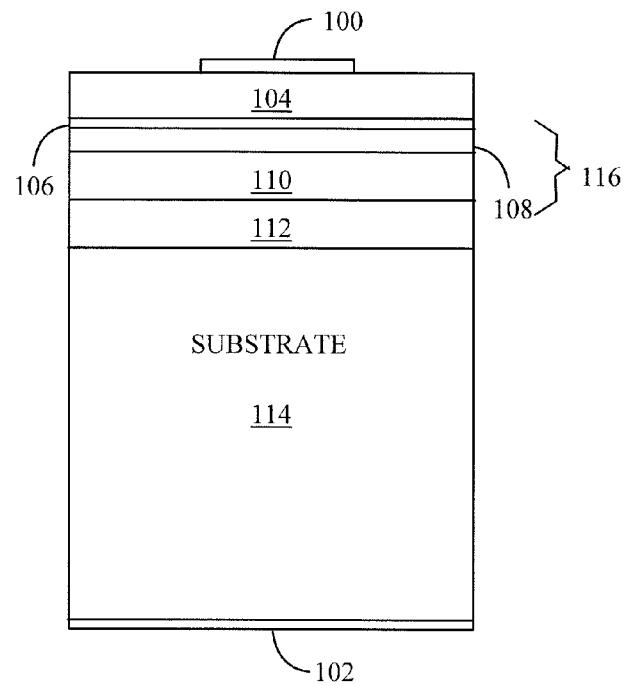
Figure 1B:
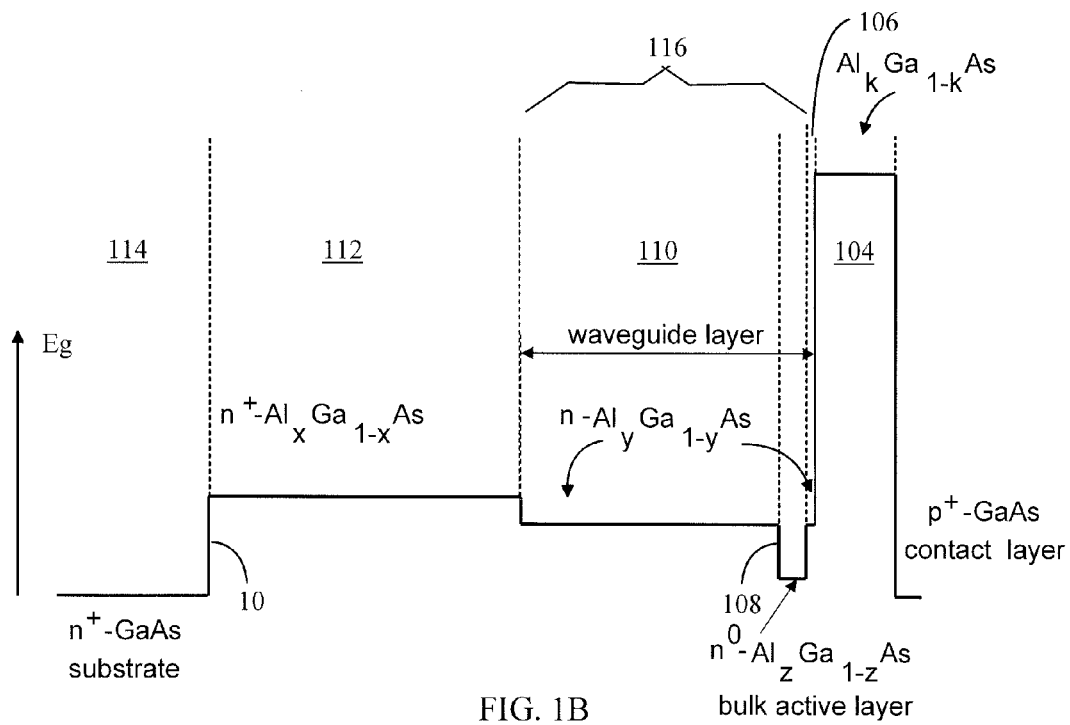

With reference to FIGS. 1A and 1B, examine an example of a semiconductor laser diode based on, for example, aluminum gallium arsenide (AlGaAs). In formulas of AlGaAs it is usual k>x>y>z. The line 10 presents in an arbitrary scale the value of an energy gap Eg between a conduction and a valence band. The laser may be layered in a double heterostructure between electrodes 100, 102, which may receive the electric power fed to the laser during operation. The electrodes 100, 102 may be metal contacts. The wide gap layer 104 may be high-doped p-type for donating excess holes. The structure from a high-doped wide gap layer 112 to the substrate 114 may be n-type for donating negative carriers. A complex narrow gap waveguide layered structure 116, which is an optical cavity for stimulated emission, may comprise layers 106 to 110, and the waveguide 116 may terminate at both ends in reflective surfaces at least one of which may finally transmit the optical pulse outwards. An active layer, where free electrons and holes exist and recombine by stimulated emission during the operation, may comprise the layer 108. The active layer 108 may be clearly much thinner than the whole waveguide 116 but much thicker than 10 nm, hence making the laser a bulk or multiple quantum wells (MQWs).

To illustrate the advantages of the proposed device, consider a simple standard lumped rate equation model for the averaged electron density N and photon density S in a semiconductor laser in the form $$dN/dt = i(t)/eV - N/\tau_n - v_g g(N,S)S, \quad (1)$$

$$dS/dt = v_g(\Gamma_a g(N,S) - \alpha)S + \Gamma_a \beta N/\tau_n, \quad (2)$$

where i is the injection current, e the electron charge, V=dLw is a volume of the active layer, with L the cavity length and w the stripe width and d the thickness of the active layer, $\tau_n(N) = 1 + B_1 N/(BN)$ is the carrier lifetime (B being the bimolecular recombination coefficient, and $B_1$ a correction coefficient taking into account saturation of the recombination rate at high N; for GaAs/AlGaAs material $B \approx 10^{-10}$ cm$^3$/s and $B1 \approx 10^{-19}$cm$^3$), $\Gamma_a$ is an optical confinement factor, $v_g$ is the group velocity of light, $\alpha = \alpha_{out} + \alpha_{in}$ is the total (outcoupling and internal parasitic) cavity losses, and β is the spontaneous emission factor. For the gain-current density relation, a two-parameter logarithmic fit for both quantum well and bulk active layers may be expressed as follows:

$$g(N,S) = G_0 ln(N/N_0)/(1+\epsilon S), \quad (3)$$

where $N_0$ is the transparency carrier density and $G_0$ is a gain constant, and ε is the gain compression factor. An output power P of an optical pulse may be calculated from S using the formula:

$$P(t)=[(\hbar\omega/e)Lwd\alpha_{out}S(t)]/\Gamma_a, \quad (4)$$

where $\hbar$ is the Planck constant and $\omega$ is a photon energy.

The current profile i(t) is a pulse, which may be described by the expression:

$$i(t)=i_0\{\tan h[(t-2\tau_p)/\tau_r]-\tan h[(t-2\tau_r-\tau_p)/\tau_d]\} \quad (5)$$

with $\tau_p$ characterizing the pulse duration, $\tau_r$ the duration of the rising (leading) front, and $\tau_d$ that of the decaying (trailing) front. In our simulations, we took $\tau_r=\tau_d=0.7$ ns, $\tau_p=2$ ns.

An optical confinement factor $\Gamma_a$ can be defined as an overlap between gain medium and the optical mode. The confinement factor $\Gamma_a$ of a high power single QW CW operation laser may lie around 0.01.

Figure 2:
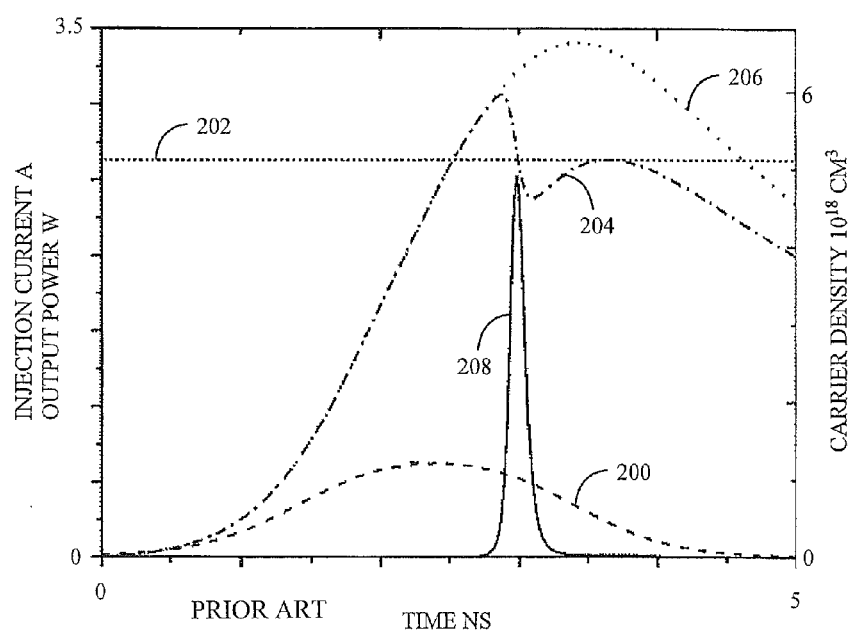
FIG. 2 illustrates transient behaviors of a prior art laser.
Figure 3:
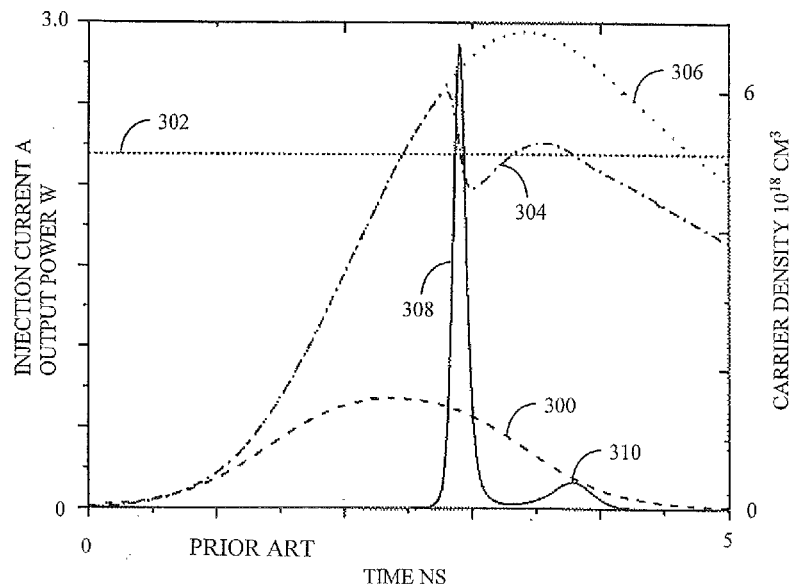
FIG. 3 illustrates transient behaviors and a trailing optical pulse of a prior art laser.

FIGS. 2 and 3 present transient behaviors of a prior art quantum well AlGaAs laser. The thickness of the active layer is d=8 nm, the confinement factor $\Gamma_a=0.01$, B=$10^{-10}$ cm$^3$/s, B$_1$=$10^{-19}$ cm$^3$ in both cases. Hence, the equivalent spot size, i.e. the ratio of the active layer to the confinement factor d/$\Gamma_a$ is 0.8 μm.

The injection current profile 200 means the electric pulse fed through electrodes to the laser structure. The threshold carrier density 202 of the carrier density defines a borderline for the laser to output either a single optical pulse or a plurality of optical pulses. If an actual carrier density transient 204 remains below the threshold carrier density 202 after the optical pulse 208, no trailing optical pulse will appear. However, if an actual carrier density transient 204 rises above the threshold carrier density 202 after the optical pulse 208, a trailing optical pulse will appear. A reference carrier density 206 behavior in the same structure without the stimulated emission can be used to compare the non-equilibrium carrier densities at laser and LED operation. The current pulse amplitude is 0.63 A in FIGS. 2 and 0.66 A in FIG. 3.

In FIG. 2, the laser is pumped with a current pulse 200 with a relatively small amplitude (0.63 A) of the injection current 200. The laser transmits a single optical pulse 208 of about 125 ps FWHM (Full Width at Half Maximum) and a modest amplitude (2.5 W), with a total energy of about 350 pJ.

The amplitude of the optical pulse 208 is proportional to the total number (density multiplied by volume) of excess carriers above the threshold value accumulated in the active layer by the time the pulse is emitted. After the pulse 208, the carrier number 204, depleted by the pulse, attempts to recover but does not reach the threshold 202 value again and the optical pulse 208 remains single.

In FIG. 3 the injection current pulse 300 amplitude has been increased to 0.66 A. The horizontal line is a threshold 302 carrier density for reference. An actual carrier density transient 304 has a response to an optical pulse 308 having a drop compared with a reference carrier density 306 behavior in the same structure without the stimulated emission. The power and energy of the output optical pulse 308 has increased along with the current pulse 300 but a trailing optical pulse 310 has also appeared.

In general, if a current amplitude 300 is increased above a certain critical value, the carrier density, depleted by the initial pulse, recovers over the threshold 302 and at least one trailing optical pulse will appear, which is highly undesirable for practical applications. The current used in FIG. 2 is deliberately chosen to be almost exactly this critical value.

In FIG. 3, where the pumping pulse amplitude in the same laser structure has been increased to 0.03 A, the trailing pulse 310 is clearly present.

Theoretically, the trailing optical pulses could be avoided if the electric injection pulse 300 had a very sharp trailing end, which, however, is non-trivial to achieve with nanosecond high-power electronics. Alternatively, one can try to delay the optical pulse generation toward the trailing end of the pumping pulse.

The problem of avoiding trailing pulses appearing while achieving high output pulse energy may be solved by using a laser with a large active layer volume V.

Then, one can apply a high-amplitude current pulse and accumulate a large total number of carriers in the active layer, while keeping the relative excess current over the threshold, and thus the excess carrier density, relatively modest.

In theory, the increase in volume can be achieved by increasing any of the three dimensions. However, high-power lasers tend to have quite broad stripes (for example width may be W=100 μm), and extending width beyond this limit leads to problems in focusing the output light.

Increasing the laser length may improve the pulse energy. Consider now a laser which is 5 mm long but otherwise identical to that of FIG. 2. The maximum pulse power achievable may be about 4.3 W. However, a longer laser also gives a longer optical pulse and has a lower threshold carrier density than the short laser which decreases the relative excess current, at which the secondary pulses appear and thus is adverse to any improvement in single pulse generation. The maximum single pulse energy may be about 780 pJ. This is a modest improvement by a factor of 2.2 compared to the shorter structure, with the laser length increased by a factor of five.

Figure 4:
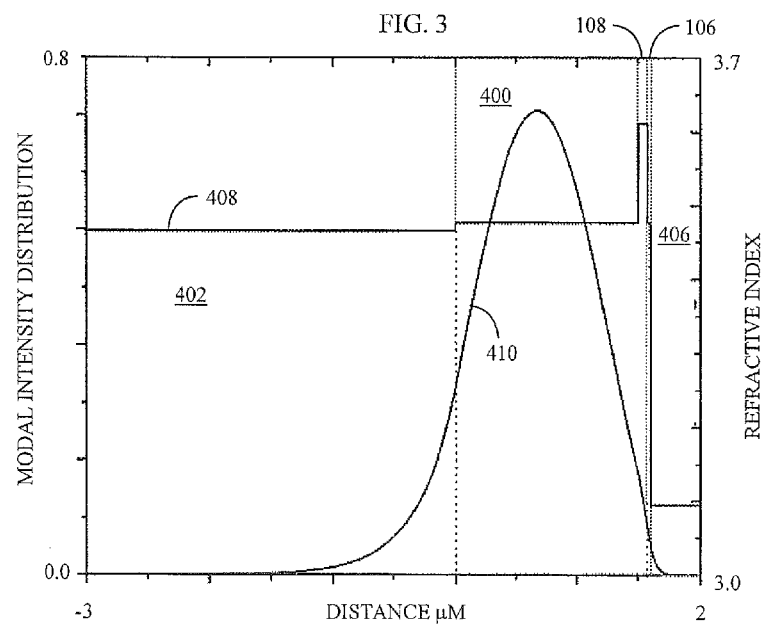
FIG. 4 shows a refractive index and light intensity distribution in a semiconductor laser.

FIG. 4 (corresponding FIGS. 1A and 1B) shows refractive indices 408 of different layers and a modal intensity distribution 410 of radiation in a bulk AlGaAs laser having a thickness of the active layer d=0.08 μm and the confinement factor $\Gamma_a=0.01$.

The laser structure can be made (radically) asymmetric as follows:

1. The refractive index of the n-doped cladding layer 402 is larger than the refractive index of the p-doped cladding layer 406.

2. The active layer 108 position is very near the p-doped cladding layer 104, 406 and quite far from n-doped cladding layer 112, 402.

The larger the differences the more radical asymmetry can be achieved. Increased asymmetry, in turn, serves as the base for a lower value of the confinement factor $\Gamma_a$, which makes the equivalent spot size larger. The thickness of the layer 106 of the waveguide is smaller than the thickness of a part of the layer 110, 400 of the waveguide. The thickness of the layer 106 may be much smaller than that of the layer 110, 400 of the waveguide and/or the thickness of the layer 106 can even be 0 μm. The refractive index of the layer 106 may be equal or approximately equal to the refractive index of the layer 110.

The difference in the claddings' refractive indices makes the optical mode eccentric such that the modal intensity distribution 410 extends more to the cladding with a larger refractive index. This eccentricity and shift from the active layer to the p-doped cladding layer decreases the confinement factor $\Gamma_a$ since the overlap of the active layer, which is the gain medium, and the optical mode can thus be reduced.

A thickness d of the active layer 108 may be larger than 50 nm. A thickness of the active layer may be, for example, from 50 nm to about 150 nm. The width of the part of the asymmetric waveguide layer 110 and other parameters of the waveguide and the cladding layers may be chosen such that the laser operates in a single fundamental transverse mode. The confinement factor $\Gamma_a$ may be lower than 0.02.

Figure 5:
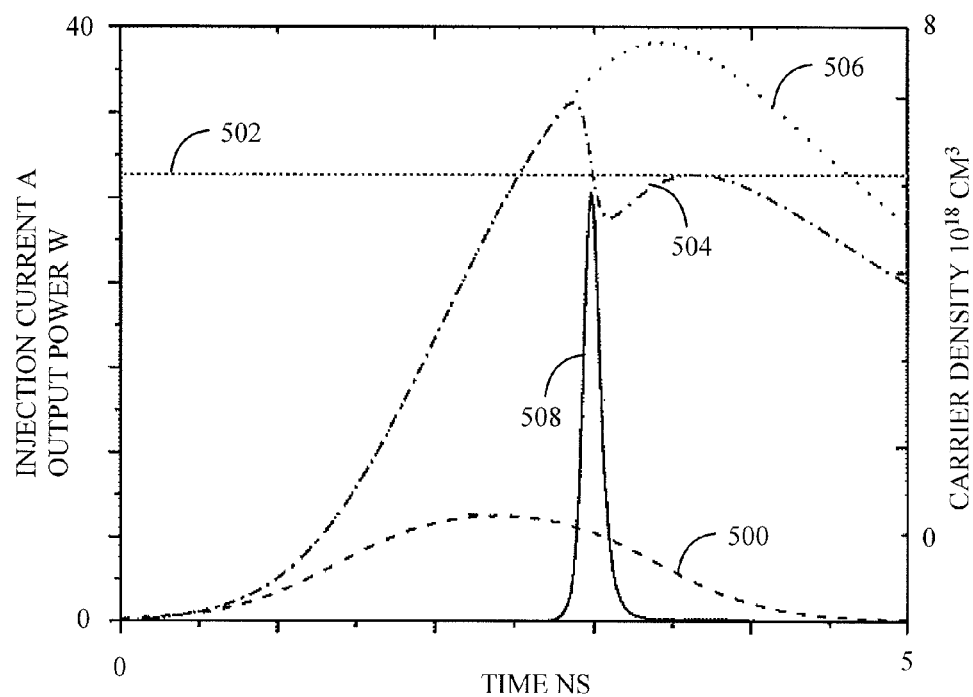
FIG. 5 illustrates transient behaviors of a laser with a large spot size.

FIG. 5 presents a transient behaviour of a bulk AlGaAs laser having a thickness of the active layer d=0.08 µm and the confinement factor $\Gamma_a$=0.01. Those are the same as in FIG. 2, except for the thickness d of the active layer 108 which has been increased by a factor of ten. The injection current profile 500 implies an electric pulse of about 2 ns and an amplitude 7.1 A. The horizontal line 502 is a threshold of carrier density. An actual carrier density transient 504 drops when the optical pulse is formed. A reference carrier density behavior 506 in the same structure without the stimulated emission does not show such a change.

In the example in FIG. 5, an injection current 500 may be about ten times higher than that used in FIG. 2, while still maintaining a single optical pulse 508. The amplitude of the optical pulse 508, in turn, may be in an order of magnitude higher than that of FIG. 2. In FIG. 5, the peak power of the optical pulse 508 is 28 W, with duration at FWHM of about 150 ps.

Figure 6:
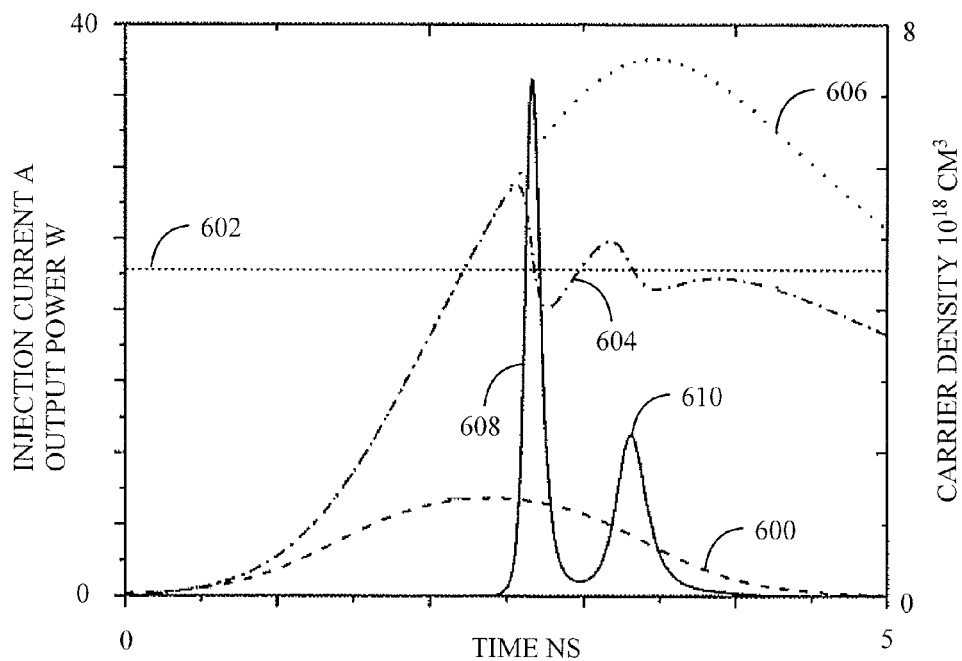
FIG. 6 illustrates transient behaviors of a laser with a slightly smaller spot size than in that in FIG. 5.

FIG. 6 corresponds to FIG. 5 except that the confinement factor $\Gamma_a$ has been increased to $\Gamma_a$=0.012. The injection current pulse 600 has a duration $\tau_p$ of about 2 ns and an amplitude of 7.1 A. The horizontal line 602 is a threshold carrier density. The increase in the confinement factor $\Gamma_a$, corresponding to the case of too thin a thickness d of the active layer 108, may lead to an emergency of at least one trailing pulse 610 in addition to the main pulse 608. A reference carrier density behavior is presented with a dotted line 606 and an actual carrier density transient is presented with a line 604 of dots and dashes.

The improvement in the laser power with increasing the active layer thickness may rely on keeping the confinement factor $\Gamma_a$ small. This may be accomplished by structural arrangements. For a constant injection current i and thickness d, an increase in the confinement factor $\Gamma_a$ decreases the threshold current, leading to a higher relative excess current and to a danger of trailing pulses appearing. If for the initial confinement factor $\Gamma_a$ the operating current pulse amplitude corresponded to the critical value for single-pulse generation, any increase in $\Gamma_a$ will place the current above the critical value leading to an emission of an optical trailing pulse.

In FIG. 6, the confinement factor $\Gamma_a$ has been increased by only a factor of 1.2 compared with the case of FIG. 5, and an trailing pulse is already well developed.

Maintaining a small optical confinement factor $\Gamma_a$ is not a trivial task given a relatively large value of the thickness d. It is not possible in most "standard" laser constructions to operate in a single fundamental transverse mode and requires that a special structure be designed.

Figure 7:
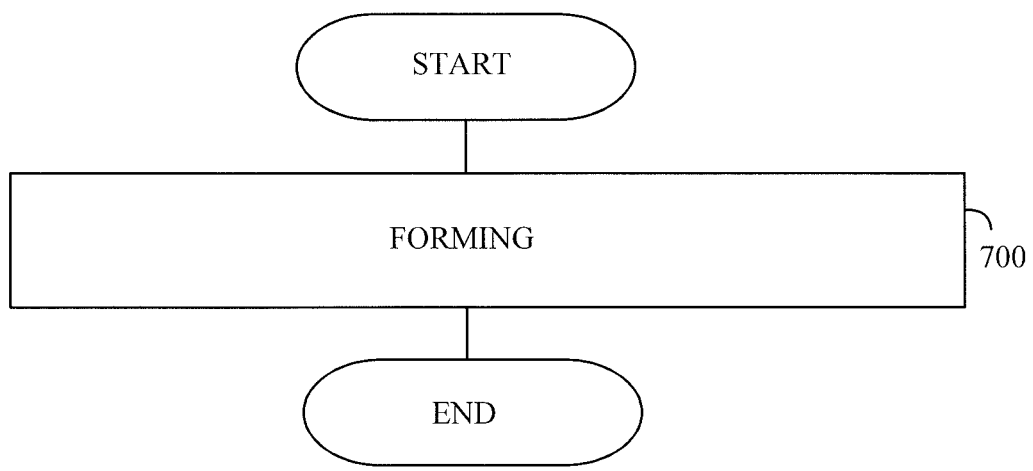
FIG. 7 illustrates a flow chart of the manufacturing method.

FIG. 7 illustrates a flow chart of the manufacturing method. In step 700, a plane asymmetric waveguide 116 with an active layer 108 in the waveguide 116 is formed such that the ratio of a thickness of the active layer 108 to a confinement factor of the laser is larger than about 5 µm.

Even though the invention has been described above with reference to an example according to the accompanying drawings, it is clear that the invention is not restricted thereto but it can be modified in several ways within the scope of the appended claims.

The invention claimed is:
1. A single pulse semiconductor laser,
the laser comprises an n-doped cladding layer and a p-doped cladding layer, with the refractive index of the n-doped cladding layer larger than that of the p-doped cladding layer, and
a waveguide layer between the n-doped cladding layer and the p-doped cladding layer, the waveguide layer containing a first part and a second part and an active layer between the first and second parts, a first end of the first part adjacent the n-doped cladding layer and a second end of the first part adjacent a first end of the active layer, a first end of the second part adjacent the p-doped cladding layer and a second end of the second part adjacent a second end of the active layer, a thickness of the second part, corresponding to the distance between the active layer and the p-doped cladding layer being less than a thickness of the first part, corresponding to the distance between the active layer and the n-doped cladding layer, and
a refractive index of the first part being constant, lower than that of the active layer and larger than that of the n-doped cladding layer,
the laser configured to operate in a single fundamental transverse mode for which the ratio of a thickness of the active layer to an active layer optical confinement factor is larger than about 2.5µm, and
the laser being configured to operate in an enhanced gain switching regime for providing a single optical pulse without at least one trailing pulse.
2. The laser of claim 1, wherein a thickness of the active layer is larger than 50 nm.
3. The laser of claim 1, wherein the optical confinement factor is lower than 0.02.
4. The laser of claim 1, wherein a thickness of the active layer is 50 nm to about 150 nm.
5. A method of manufacturing a single pulse semiconductor laser, the method comprising:
forming a plane asymmetric waveguide between an n-doped cladding layer and a p-doped cladding layer with the refractive index of the n-doped cladding layer larger than that of the p-doped cladding layer, the waveguide containing a first part and a second part and an active layer between the first and second parts, a first end of the first part adjacent the n-doped cladding layer and a second end of the first part adjacent a first end of the active layer, a first end of the second part adjacent the p-doped cladding layer and a second end of the second part adjacent a second end of the active layer, forming a thickness of the second part, corresponding to a distance between the active layer and the p-doped cladding layer being less than a thickness of the first part, corresponding to a distance between the active layer and the n-doped cladding layer, a refractive index of the first part being constant, lower than that of the active layer and larger than that of the n-doped cladding layer, to operate in a single fundamental transverse mode for which the ratio of a thickness of the active layer to an active layer optical confinement factor is larger than about 2.5 µm, and
the laser being configured to operate in an enhanced gain switching regime for providing a single optical pulse without at least one trailing pulse.
6. The method of claim 5, the method further comprising forming a thickness of the active layer larger than 50 nm.
7. The method of claim 5, the method further comprising forming the optical confinement factor lower than 0.02.

8. The method of claim 5, the method further comprising forming the active layer with a thickness between 50 nm and about 150 nm.

9. A single pulse semiconductor laser,
the laser comprises an n-doped cladding layer and a p-doped cladding layer, with the refractive index of the n-doped cladding layer larger than that of the p-doped cladding layer, and
a waveguide layer between the n-doped cladding layer and the p-doped cladding layer, the waveguide layer containing a first part and a second part and an active layer between the first and second parts, a first end of the first part adjacent the n-doped cladding layer and a second end of the first part adjacent a first end of the active layer, a first end of the second part adjacent the p-doped cladding layer and a second end of the second part adjacent a second end of the active layer, a thickness of the second part, corresponding to the distance between the active layer and the p-doped cladding layer being less than a thickness of the first part, corresponding to the distance between the active layer and the n-doped cladding layer, and
a refractive index of the first part being constant, lower than that of the active layer and larger than that of the n-doped cladding layer,
the laser configured to operate in a single fundamental transverse mode for which the ratio of a thickness of the active layer to an active layer optical confinement factor is larger than about 2.5 µm, and
the laser driven with a current pulse with a width of about 2 ns for operation in the enhanced gain switching regime providing a single optical pulse without at least one trailing pulse.

* * * * *